(12) United States Patent
Gong et al.

(10) Patent No.: US 8,009,462 B2
(45) Date of Patent: Aug. 30, 2011

(54) SRAM ARCHITECTURE

(75) Inventors: Cihun-Siyong Gong, Kaosiung (TW);
Ci-Tong Hong, Xinzhuang (TW);
Muh-Tian Shiue, Hsinchu (TW);
Kai-Wen Yao, Hengchun Township, Pingtung County (TW)

(73) Assignee: National Central University, Jhongli (TW)

( * ) Notice: Subject to any disclaimer, the term of this patent is extended or adjusted under 35 U.S.C. 154(b) by 184 days.

(21) Appl. No.: 12/499,135

(22) Filed: Jul. 8, 2009

(65) Prior Publication Data

US 2011/0007556 A1   Jan. 13, 2011

(51) Int. Cl.
*G11C 11/00* (2006.01)
*G11C 8/00* (2006.01)
(52) U.S. Cl. .................... 365/154; 365/230.05
(58) Field of Classification Search .................. 365/154, 365/156, 230.05
See application file for complete search history.

(56) References Cited

U.S. PATENT DOCUMENTS

| | | | | |
|---|---|---|---|---|
| 5,946,251 A | * | 8/1999 | Sato et al. | 365/203 |
| 5,973,984 A | * | 10/1999 | Nagaoka | 365/230.03 |
| 7,414,903 B2 | * | 8/2008 | Noda | 365/201 |

* cited by examiner

*Primary Examiner* — Anh Phung (57) ABSTRACT

A SRAM architecture includes a read/write control signal, a read/write control transistor block, an equalize transistor block, a 6-T SRAM cell, a sense amplifier block, a column selection transistor block and a write driver. The 6-T SRAM cell can store and write data. The sense amplifier block is used to read out the data stored in the 6-T SRAM cell correctly when the SRAM architecture performs a read operation and makes bit lines BL (bit line) and BLB($\overline{\text{bitline}}$) produce a minimum voltage difference. The column selection transistor block is used to select a column that the data is written in and read out. The write driver is used to perform a write operation to the 6-T SRAM cell of the column. The SRAM architecture can effectively increase the read SNM and dramatically reduce the power consumption.

1 Claim, 9 Drawing Sheets

FIG.8
PRIOR ART the US 8,009,462 B2

SRAM ARCHITECTURE

BACKGROUND OF THE INVENTION

1. Field of Invention

The invention relates to static random access memory (SRAM) and, more particularly, to a compact and low-power SRAM with improved read static noise margin (SNM).

2. Description of Related Art

Figure 8:
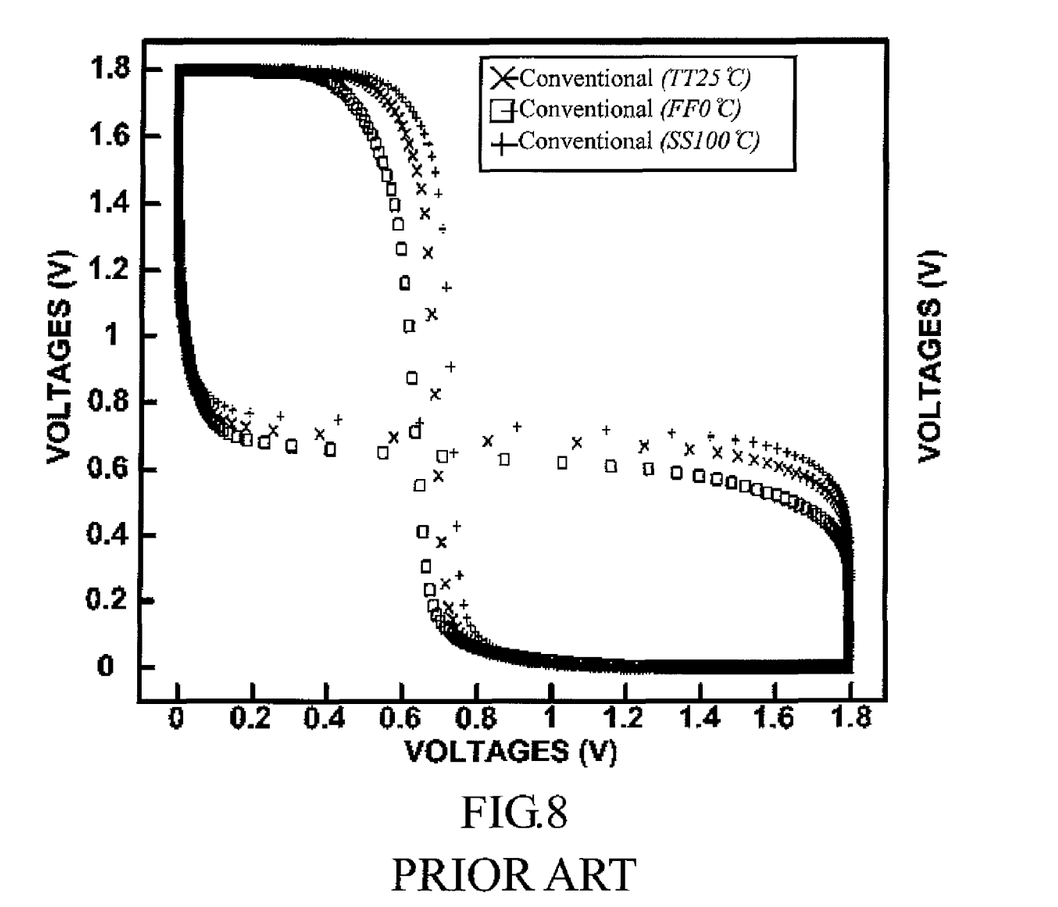
FIG. 8 is a butterfly curve showing the skewed read SNM of a conventional SRAM for different combinations of the process corner and temperature.

Decreasing the supply voltage can effectively reduce the power consumption of conventional static random access memory (SRAM). However, it is unfortunate that the decrease in supply voltage can also result in degraded read stability and, hence, can lead to increased fail-bit rate. As shown in FIG. 8, the butterfly curve showing the skewed read SNM of the conventional SRAM for different combinations of the process corner and temperature indicates the cause of the problem in the fail-bit rate. Motivated by this, there have been numerous SRAM architectures currently demonstrated in the literature which focus on making better tradeoff between the power dissipation and supply voltage, and it has been proved that they were able to improve the read SNM.

However, despite their effectiveness, these conventional SRAM architectures also come with the penalty of increased implementation area and design complexity. For example, one of the conventional SRAM architectures, termed dual-boosted cell based SRAM, was designed to improve read SNM at low supply voltage. However, the techniques of the architecture are very likely to cause transistor breakdown. Moreover, owing to the needs of multiple supply voltages and accurate control, such a design in the prior art is with increased circuit complexity as compared to the conventional SRAM structure, leading to increase in implementation area.

Furthermore, FIG. 8 is a conventional schematic diagram illustrating different process corners and temperatures for read SNM according to the conventional SRAM architecture. In summary, the conventional SRAM architectures have many problems such as low read stability, high power, low speed and large area. Especially, in modern manufacturing processes, the supply voltage descends by a wide margin. Despite that, the decrease in the supply voltage can facilitate the decrease in the dynamic power consumption of the SRAM. When the SRAM perform a read operation at high speed, stability is a key factor about performance of the SRAM. Thus, the need for improvement still exists.

SUMMARY OF THE INVENTION

It is therefore one object of the invention to provide a SRAM architecture comprising: a read/write control transistor block, an equalize transistor block, a 6-T SRAM cell, a sense amplifier block, a column selection transistor block and a write driver. The read/write control transistor block is controlled by a read/write control signal. When the SRAM architecture performs a write operation, the read/write control transistor block electrically connects a path of a bit line BL (bit line) and a path of a bit line BLB(bitline) to a power supply respectively, and when the SRAM architecture is not at a write operation, the read/write control transistor block disconnects the path of the bit line BL (bit line) and the path of the bit line BLB(bitline) from the power supply respectively. The equalize transistor block for making the bit lines BL (bit line) and BLB(bitline) equal to a level which is an average value of voltages of the bit lines BL (bit line) and BLB(bitline). The 6-T SRAM cell is for storing and writing data.

When the SRAM architecture performs a read operation and makes the bit lines BL (bit line) and BLB(bitline) generate a minimum voltage difference therebetween, the sense amplifier block reads out the data stored in the 6-T SRAM cell. The column selection transistor block for selecting a column of the data to be written in or read out when the column of the data is enabled, and the paths of the bit lines BL (bit line) and BLB (bitline)is disconnected from the sense amplifier block when the data stored in the 6-T SRAM cell is read out and the sense amplifier block is enabled. The write driver performs a write operation on the 6-T SRAM cell when the SRAM architecture performs a write operation.

The read/write control transistor block, the equalize transistor block, the 6-T SRAM cell, the sense amplifier block, the column selection transistor block, and write driver are electrically connected with each other.

In a first aspect of the present invention, the write operation of the SRAM architecture ends with a read operation being performed thereafter by disabling the read/write control transistor block. The equalize transistor block is enabled to make each of the bit lines BL (bit line) and BLB(bitline) have a voltage equal to a voltage level that makes the sense amplifier block generate a maximum voltage gain. A word line is enabled to make the bit lines BL (bit line) and BLB(bitline) generate a voltage difference therebetween. The sense amplifier block is enabled and the column selection transistor block is disabled when the voltage difference is more than a predetermined minimum value and the voltages of the bit lines BL (bit line) and BLB(bitline) are varied within a predetermined voltage range. The sense amplifier block is enabled to read the data to out and out respectively.

By utilizing the invention, the following advantages are obtained. First, the present invention can effectively increase the read SNM of the SRAM and can dramatically reduce the power consumption. Moreover, the present invention can leave the design complexity and area overhead almost the same as those of the traditional counterpart.

The invention will become more obvious from the following description when taken in connection with the accompanying drawings.

DETAILED DESCRIPTION OF THE INVENTION

Referring to FIGS. 1 to 7, a SRAM architecture in accordance with a preferred embodiment of the invention is shown. The SRAM architecture is in the form of a single column. The SRAM architecture includes a read/write control signal, a read/write control transistor block, an equalize transistor block, a 6-T SRAM cell, a sense amplifier block, a column selection transistor block and a write driver. The read/write control transistor block comprises read/write control transistors P1, P2. The read/write control transistor block is controlled by the read/write control signal. When the SRAM architecture performs a write operation, the read/write control transistor block making two paths of two bit lines BL (bit line) and BLB($\overline{\text{bitline}}$) connected to a power supply is electrified. When the SRAM architecture is not at a write operation, the read/write control transistor block making two paths of bit lines BL (bit line) and BLB($\overline{\text{bitline}}$) connected to a power supply is turned off.

Figure 1:
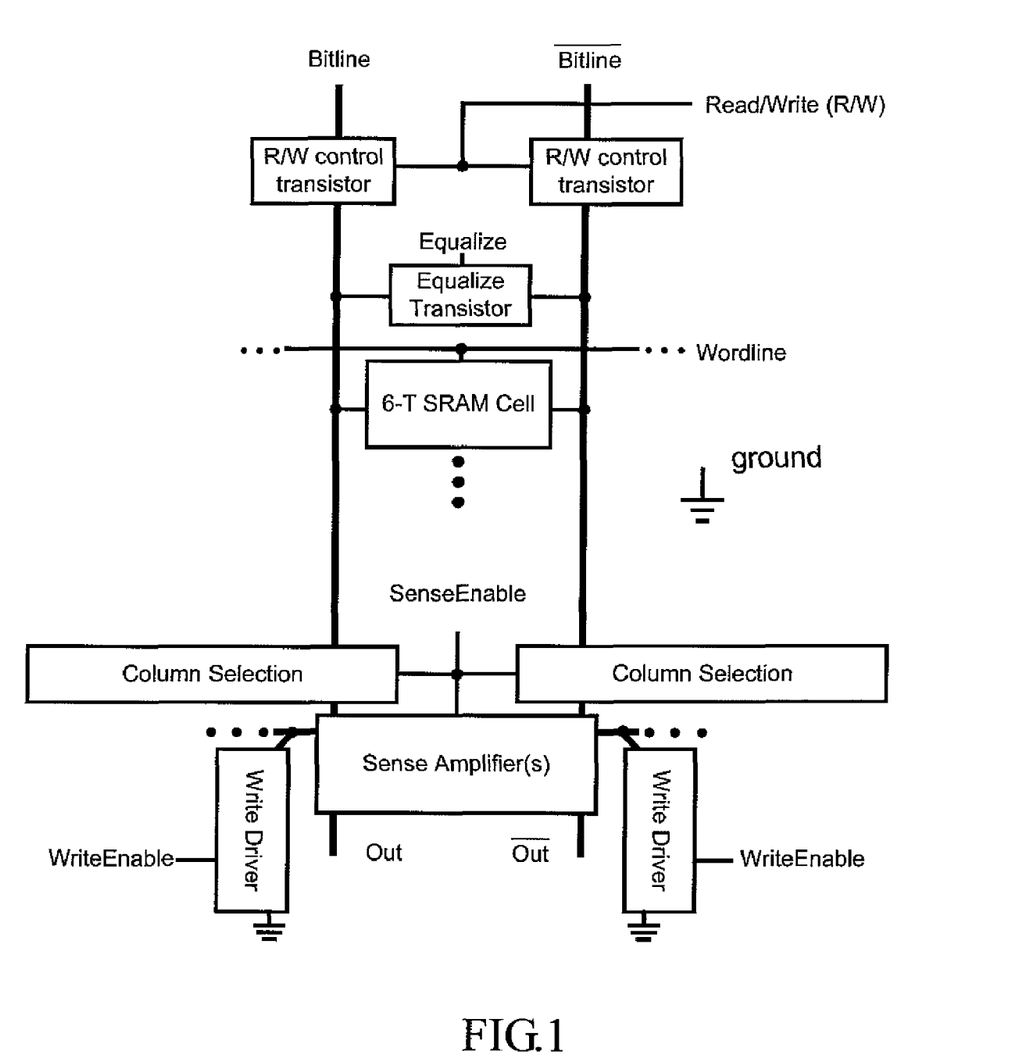
FIG. 1 is a schematic diagram illustrating a SRAM architecture according to a preferred embodiment of the invention.

The equalize transistor block comprises an equalize transistor P3. The equalize transistor block makes the two bit lines equalized to a level which is the average voltage of BL and BLB. The 6-T SRAM cell can store and write data. The sense amplifier block is used to read out the data stored in the 6-T SRAM cell correctly when the SRAM architecture performs a read operation and makes the bit lines BL (bit line) and BLB($\overline{\text{bitline}}$) produce a minimum voltage difference. The column selection transistor block is used to select a column that the data is written in and read out. The column selection transistor block can decide if the column is turned on to be written in or read out. The column selection transistor block can also be used to separate connecting paths between the two bit lines and the sense amplifier block when the data stored in the 6-T SRAM cell of the column is read out and the sense amplifier block turns on. The write driver is used to perform a write operation to the 6-T SRAM cell of the column when the SRAM architecture performs a write operation. The read/write control transistor block, the equalize transistor block, the 6-T SRAM cell, the sense amplifier block, the column selection transistor block and write driver are electrically connected with each other.

Preferably, when the write operation of the SRAM architecture ends and performs a read operation, the read/write control transistor block turns off, and the equalize transistor block turns on to make the two bit lines BL (bit line) and BLB($\overline{\text{bitline}}$) equalize a voltage level that can make the sense amplifier block achieve maximum voltage gain. Then, the word line turns on to make the bit lines BL (bit line) and BLB($\overline{\text{bitline}}$) produce a minimum voltage difference. When the voltage difference is enough and the voltage of the two bit lines BL (bit line) and BLB ($\overline{\text{bitline}}$) is stable, the column selection transistor block is turned off and the sense amplifier block is turned on. The sense amplifier block can read the data correctly to out and $\overline{\text{out}}$.

Besides, the present invention provides a novel SRAM architecture that can improve read SNM effectively with almost no increase in area and complexity. Moreover, the present invention can also have low power consumption.

Referring to FIG. 1, the SRAM architecture in the present invention is in the form of a single column. The read/write(R/W) transistor of the conventional SRAM architecture is connected in the form of static loads, in the form of a diode-connected load or in the form of loads controlled by an equalize transistor. In other words, both the read/write transistor and the equalize transistor in the conventional SRAM architecture are controlled by equalizing. It is the conventional pre-charge process of the conventional SRAM architecture.

Figure 2:
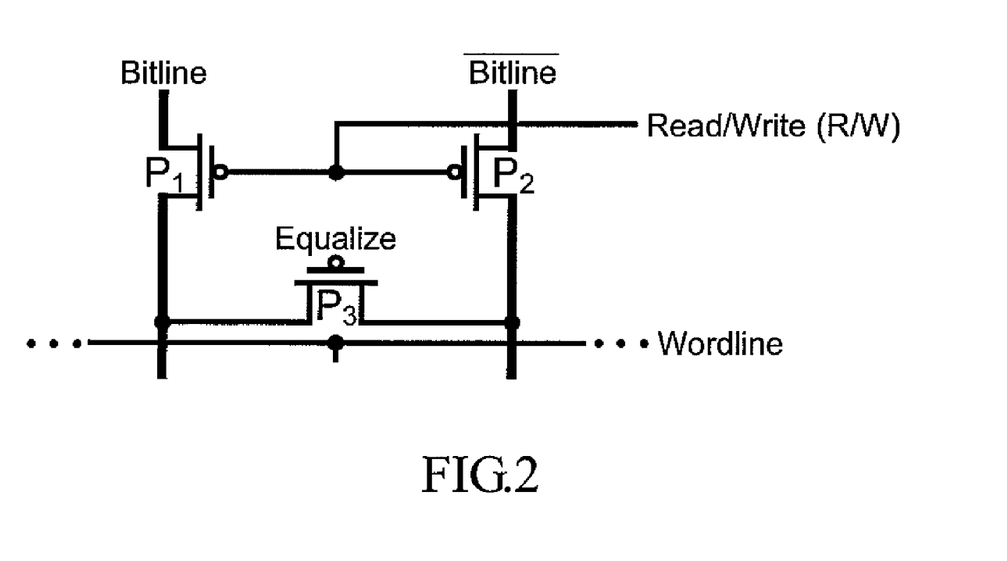
FIG. 2 is a circuit diagram illustrating a read/write transistor block and an equalize transistor block according to the preferred embodiment of the invention.
Figure 3:
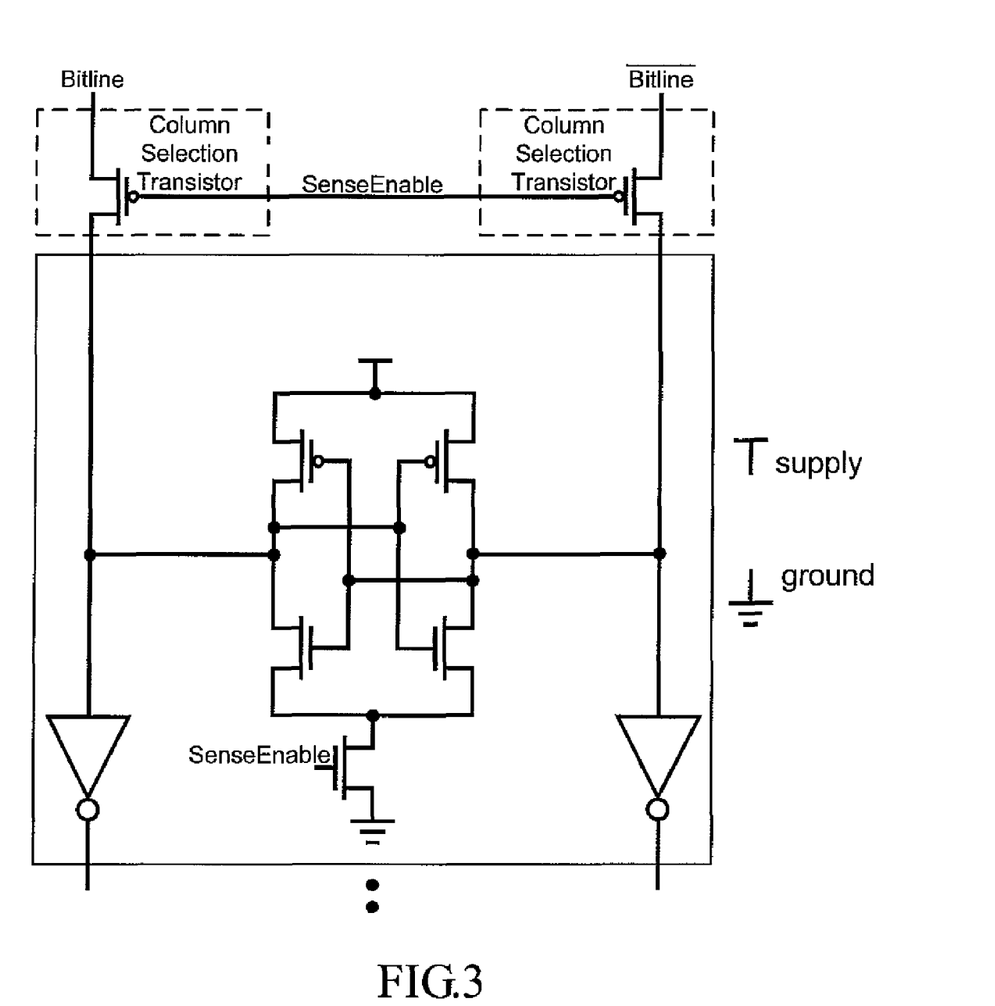
FIG. 3 is a circuit diagram illustrating a column selection transistor block and a sense amplifier according to the preferred embodiment of the invention.

On the contrary, the read/write control transistor in the present invention is controlled by a read/write control signal. The read/write control signal is independent from the signal controlling the equalize transistor. The major difference between the present invention and the conventional one is the inexistence of a pre-charge process. In order to explain the effect of the present invention, FIG. 2 is a circuit diagram illustrating a read/write transistor block and an equalize transistor block according to the preferred embodiment of the invention. FIG. 3 is a circuit diagram illustrating a column selection transistor block and a sense amplifier according to the preferred embodiment of the invention. Referring to FIGS. 2 to 3, designers can design according to their own demand by utilizing different categories among the read/write control transistor, the equalize transistor, the sense amplifier and the column selection transistor. The sense amplifier has to match up the read/write control transistor and the equalize transistor.

Figure 4:
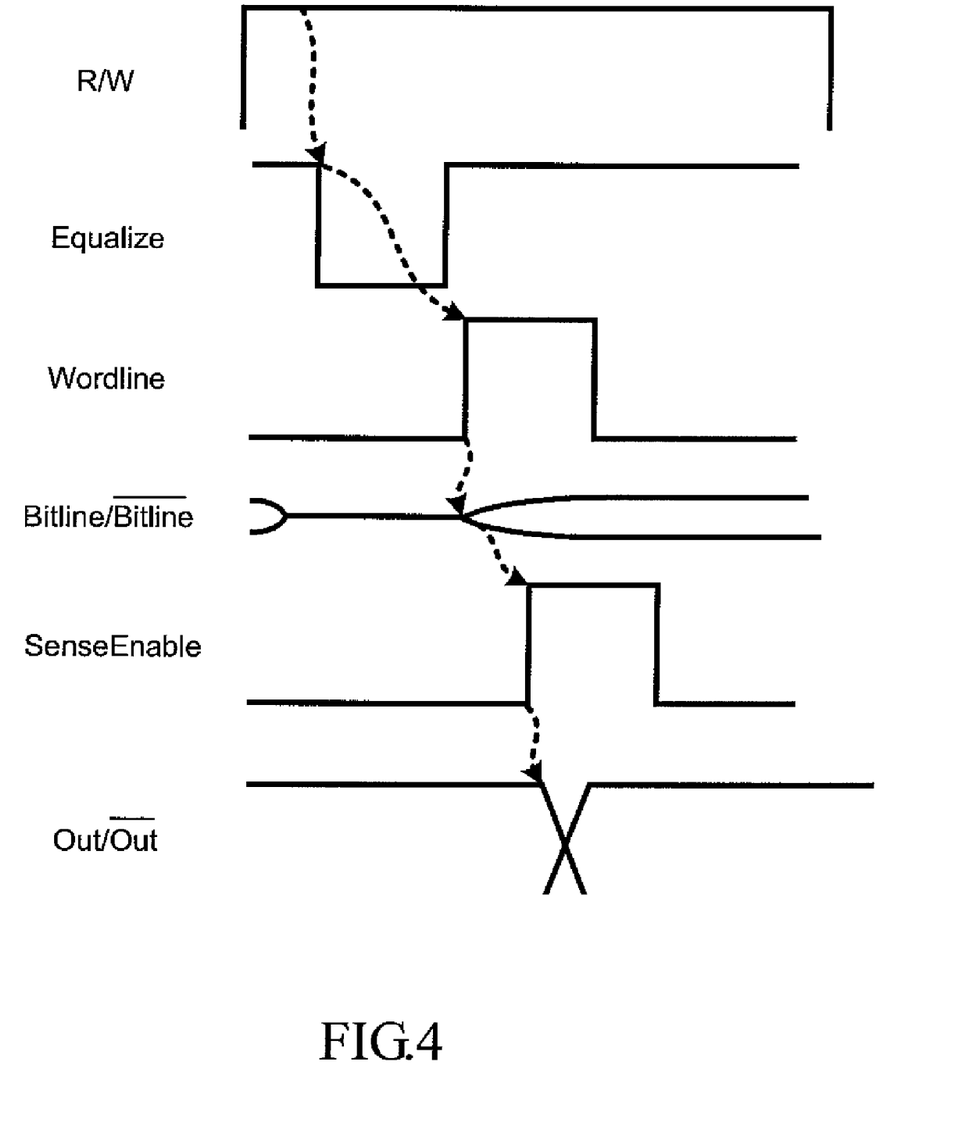
FIG. 4 is a timing diagram of the SRAM architecture during a read operation according to the preferred embodiment of the invention.

FIG. 4 is a timing diagram of the SRAM architecture during a read operation according to the preferred embodiment of the invention. The timing diagram of the SRAM architecture in FIG. 4 is obtained from the disclosed architecture in FIG. 2 and FIG. 3. If not utilizing the transistors and circuit category disclosed in FIG. 2 and FIG. 3, operation steps are the same, but each logical level of each waveform has to be changed respectively.

Referring to FIG. 1, the read/write control transistor block is controlled by the read/write control signal. When the SRAM architecture performs a write operation, the read/write control transistor block making two paths of two bit lines BL (bit line) and BLB($\overline{\text{bitline}}$) connected to a power supply is electrified. When the SRAM architecture is not at a write operation, the read/write control transistor block making two paths of bit lines BL (bit line) and BLB($\overline{\text{bitline}}$) connected to a power supply is turned off.

The equalize transistor block makes the two bit lines equalized to a level which is the average voltage of BL and BLB. The 6-T SRAM cell can store and write data. SRAM is an integrated circuit combined by a plurality of the architectures disclosed in FIG. 1. The sense amplifier block is used when the SRAM architecture performs a read operation, making the bit lines BL (bit line) and BLB($\overline{\text{bitline}}$) produce a minimum voltage difference. The sense amplifier block is able to read out the data stored in the 6-T SRAM cell correctly.

The column selection transistor block is used to select a column that the data is written in and read out. The column selection transistor block can decide if the column turned on is to be written in or read out. The column selection transistor block can also be used to separate connecting paths between the two bit lines and the sense amplifier block when the data stored in the 6-T SRAM cell of the column is read out and the sense amplifier block turns on. The write driver is used to perform a write operation to the 6-T SRAM cell of the column when the SRAM architecture performs a write operation. The read/write control transistor block, the equalize transistor block, the 6-T SRAM cell, the sense amplifier block, the column selection transistor block and write driver are electrically connected with each other.

Furthermore, referring to Figs. I and 4, FIG. 4 is a timing diagram of the SRAM architecture during a read operation in Fig. I . When the write operation of the SRAM architecture ends and performs a read operation, the read/write control transistor block turns off and the equalize transistor block turns on to make the two bit lines BL (bit line) and BLB($\overline{bitline}$) equalize a voltage level that can make the sense amplifier block achieve maximum voltage gain. Then, the word line turns on to make the bit lines BL (bit line) and BLB($\overline{bitline}$) produce a minimum voltage difference. When the voltage difference is enough and the voltage of the two bit lines BL (bit line) and BLB($\overline{bitline}$) is stable, the sense amplifier block turns the column selection transistor block off and turns on the sense amplifier block. The sense amplifier block can read the data correctly to out and $\overline{out}$.

The SRAM architecture proposed in the present invention can increase the speed of sensing and readout, because the equalize transistor can make the two bit lines BL (bit line) and BLB($\overline{bitline}$) equalize to a voltage level that can make the sense amplifier block achieve maximum voltage gain. However, the voltage level of the conventional SRAM architectures can not make the conventional sense amplifier block achieve maximum voltage gain after pre-charge. The proposed SRAM architecture also adopts the same 6-T SRAM cell as that of the conventional counterpart, but does not have to maintain the specific geometry ratio between the transistors of the cell.

Figure 5:
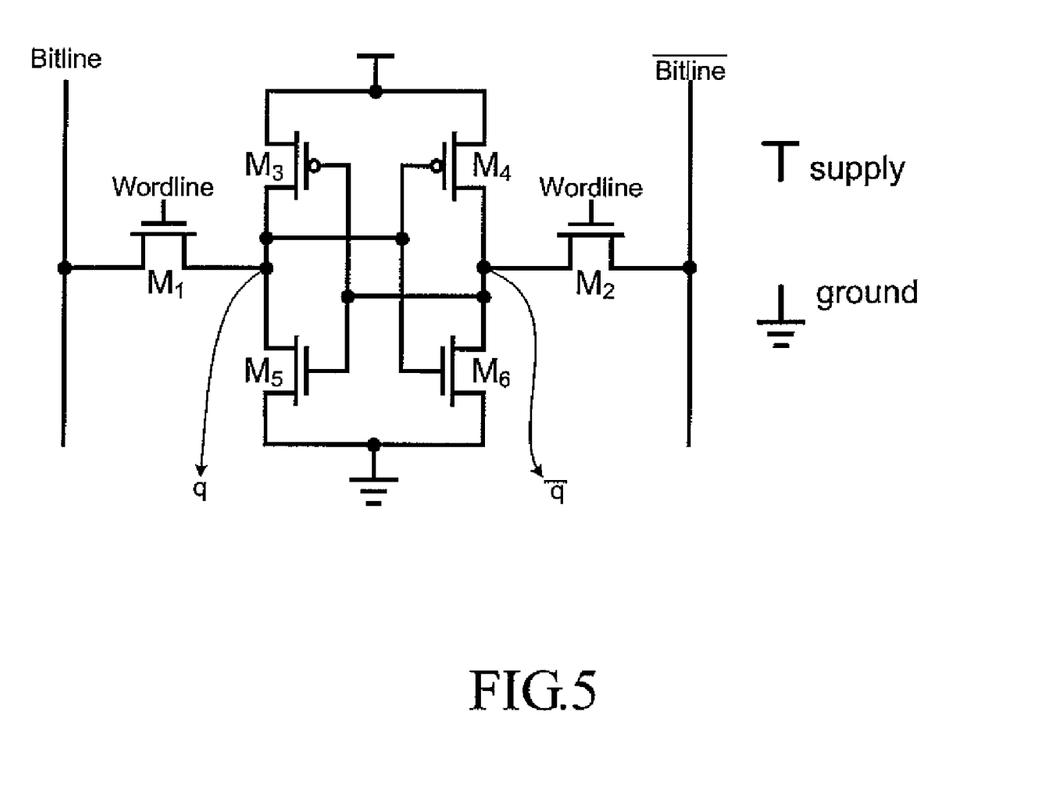
FIG. 5 is a circuit diagram illustrating a 6-T SRAM cell according to the preferred embodiment of the invention.

Conventionally, in order to accomplish a correct write operation, the channel width of the first transistor M1 should be bigger than the channel width of the third transistor M3. Similarly, the channel width of the second transistor M2 should be bigger than the channel of the fourth transistor M4. The channel length of each transistor shown in FIG. 5 is assumed to be equal.

Conventionally, in order to accomplish a correct read operation and a maximum read speed, the channel width of the fifth transistor M5 should be bigger than the channel width of the first transistor M1. Similarly, the channel width of the sixth transistor M6 should be bigger than the channel width of the second transistor M2. The problem of the voltages of two bit lines BL (bit line) and BLB($\overline{bitline}$) is solved as both BL and BLB are precharged in the read operation are with voltages significantly higher than the voltage level that the sense amplifier can achieve with its maximum voltage gain.

Thus, for the conventional architecture, the 6-T SRAM cell adopted the channel width of the fifth transistor M5 which must be much bigger than the channel width of the third transistor M3. Similarly, the channel width of the sixth transistor M6 must be much bigger than the channel width of the fourth transistor M4. This leads to the conventional architecture having a skewed and, hence, poor read SNM. The SRAM architecture proposed in the present invention can make the voltage level of the bit lines BL (bit line) and BLB($\overline{bitline}$) in the domain so that the sense amplifier can achieve its maximum voltage gain after equalizing. This can lead to an increase in the speed of sensing and readout. Thus, the SRAM architecture proposed in the present invention does not have to maintain a specific geometry ratio between each transistor.

Conventional architecture must be limited to follow the rule that the channel width of the fifth transistor M5 must be much bigger than the channel width of the third transistor M3, and the channel width of the sixth transistor M6 must be much bigger than the channel width of the fourth transistor M4. The present invention does not have to follow this rule. However, in the write operation, the present invention still has to maintain a specific geometry ratio between the transistors M1 and M3 as well as the transistors M2 and M4.

The SRAM architecture proposed in the present invention has been verified by using a 0.18 μm technology from Taiwan Semiconductor Manufacturing Company Limited (TSMC), a semiconductor company in Taiwan. The present invention is not limited to specific manufacturing process.

In order to compare the present invention and the conventional architecture objectively, a conventional SRAM architecture is provided to make a comparison. The conventional SRAM architecture and the present invention both can have several characteristics: 1. minimum area: Both of them are compact; 2. the same operation speed: Both of them are able to load 1 GHz; the operation speed can be adjusted according to different application needs; 3. The supply voltage conforms to a standard voltage such as 1.8V.

In addition, in order to completely show the efficiency of the present invention, various combinations of three process corners including TT(Typical-Typical), FF(Fast-Fast) and SS(Slow-S low) and several temperatures are adopted to verify and analyze. Referring to the obtained SNM results in FIGS. 8 and 6a, the read SNM of the architecture in the present invention is much better than the read SNM of the conventional architecture. In a deep-submicron process and other modem processes, the mismatch effect between the transistors of the cell becomes significant to the performance of the SRAM. Thus, the simulation and test of the mismatch effect to the read SNM is provided for the conventional architecture and the present invention.

By adjusting the threshold voltages(Vt) of the p-type transistor and the n-type transistor in the 6-T SRAM cell, such as adjusting the threshold voltage of the third transistor M3 and the threshold voltage of the fifth transistor M5 at the same time or adjusting the threshold voltage of the fourth transistor M4 and the threshold voltage of the sixth transistor M6 simultaneously, by 10%, one can obtain 0.9 Vt or 1.1 Vt to be equivalent to a mismatch effect between the transistors.

Figure 6A:
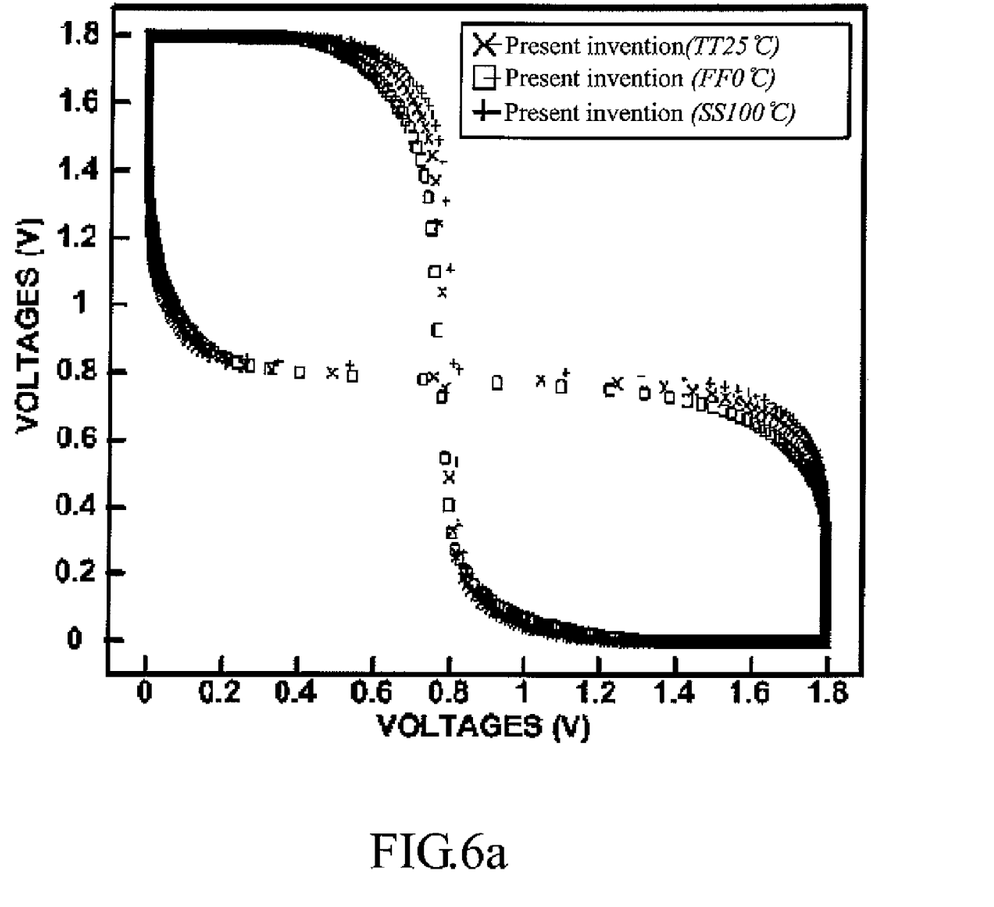
FIG. 6a is a schematic diagram illustrating different process corners and temperatures for a read SNM according to the preferred embodiment of the invention.
Figure 6B:
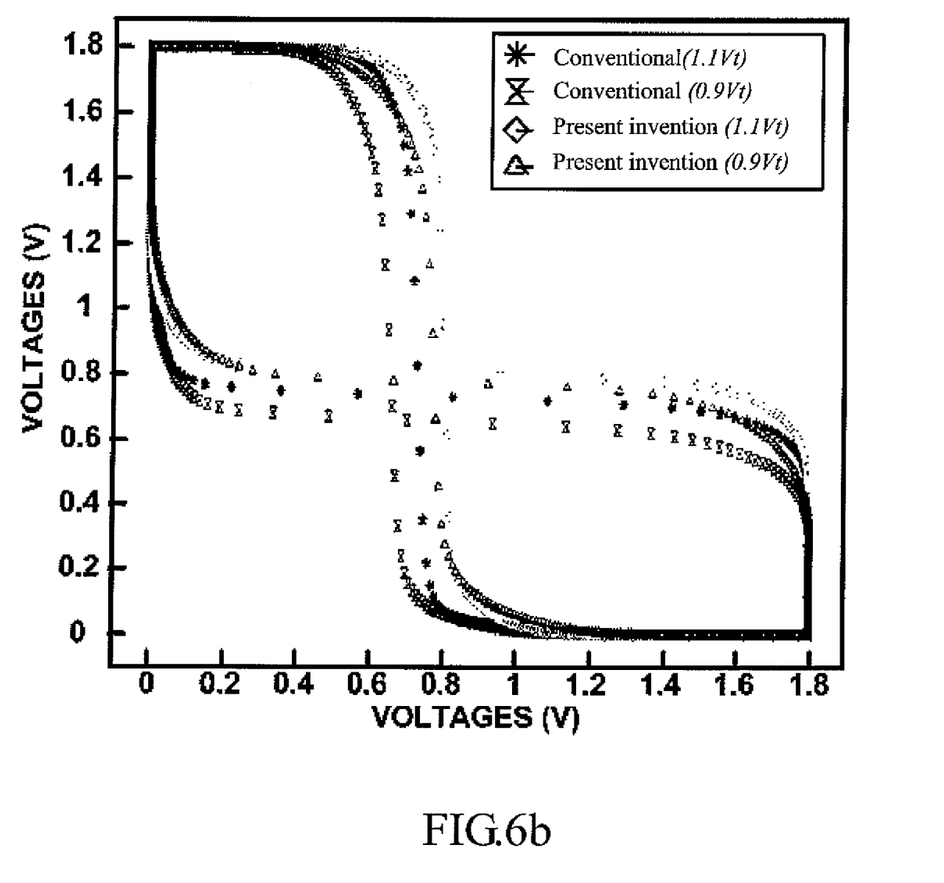
FIG. 6b is a comparison schematic diagram illustrating an effect of threshold voltage mismatch on read SNM according to the preferred embodiment of the invention.

FIG. 6b shows the results illustrating the effect of the threshold voltage mismatch on read SNM for the conventional and proposed SRAM architectures, according to the adjusted threshold voltages mentioned above. The results clearly indicate that the variation of the present invention influenced by the mismatch effect is significantly smaller than the variation of the conventional SRAM architecture. Thus, it clearly can be seen that the present invention can perform better.

Figure 7:
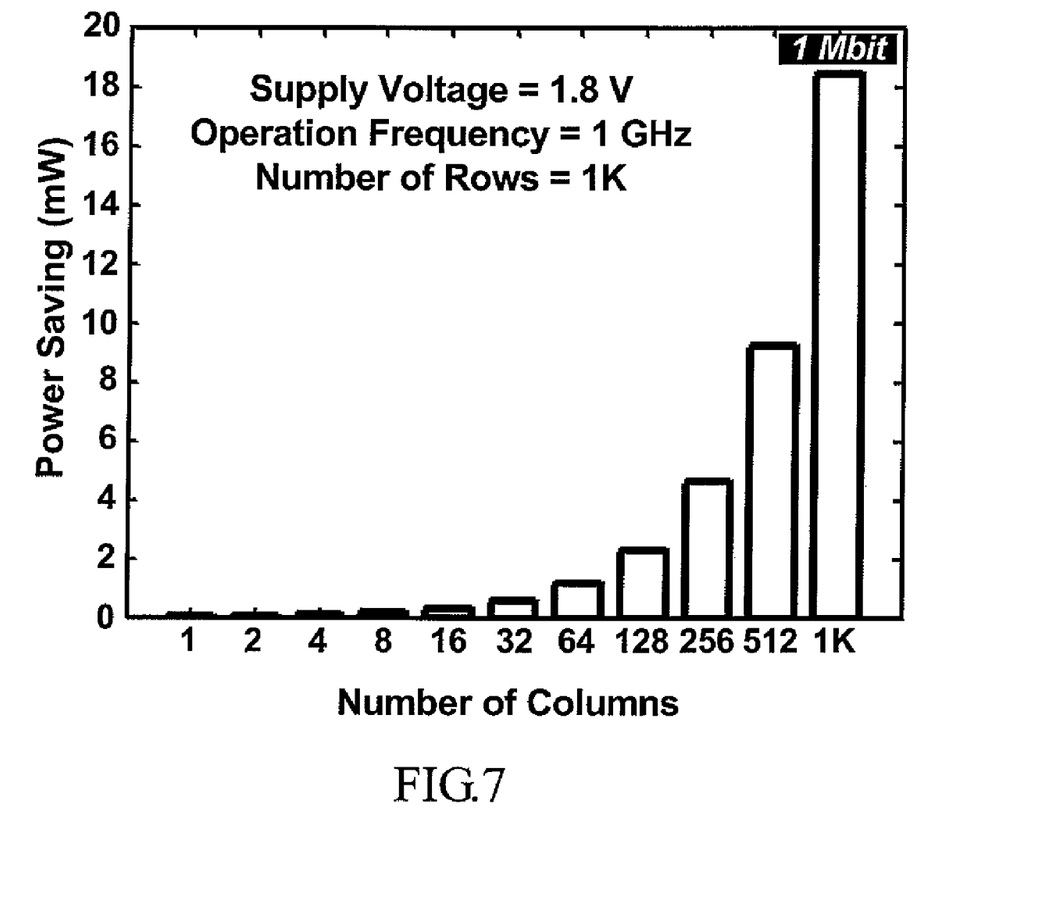
FIG. 7 is a schematic diagram illustrating power saving according to the preferred embodiment of the invention.

The present invention can maintain a small area by utilizing the 6-T SRAM cell. FIG. 7 shows the histogram illustrating that the present invention can have power saving compared to the conventional architecture, in a fixed row and specific operation condition. Because the present invention replaces the operation of the pre-charge in the conventional SRAM architecture with the operation of the pre-equalize, the two bit lines BL (bit line) and BLB($\overline{bitline}$) are not directly and electrically connected to the power supply during read, thereby having lower power consumption compared to the conventional SRAM architecture.

For example, the proposed architecture has been verified in a 0.18-μm technology. By operating both the SRAM designs in a supply voltage of 1.8 V, the SRAM with the proposed architecture demonstrates a reduction in consumed power compared to that with the conventional architecture. The proposed SRAM can achieve a clock speed of more than 1 GHz, accompanying a power consumption of 8.932 mW.

To conclude, in the present invention, a structural solution to the tradeoffs among low power, small area, high speed and high read stability of the SRAM is presented. The present invention thus provides an improved SRAM architecture. First, the present invention can effectively increase the read SNM of the SWAM. Moreover, the present invention can leave the design complexity and area overhead almost the same as those of the traditional counterpart.

In other words, in contrast to the conventional SRAM architectures, the present invention can not only enhance the read SNM of the SRAM but also leave the design complexity and area overhead almost the same as those of the tradition counterpart. In addition, the present invention can also dramatically reduce the power consumption of the SRAM, while at the same time keeping all of the advantages mentioned above.

While the invention herein disclosed has been described by means of specific embodiments, numerous modifications and variations could be made thereto by those skilled in the art without departing from the scope and spirit of the invention set forth in the claims.

What is claimed is:

1. A static random access memory (SRAM) architecture comprising:

a read/write control transistor block controlled by a read/write control signal, wherein when the SRAM architecture performs a write operation, the read/write control transistor block electrically connects a path of a bit line BL (bit line) and a path of a bit line BLB ($\overline{\text{bitline}}$) to a power supply respectively, and when the SRAM architecture is not at the write operation, the read/write control transistor block disconnects the path of the bit line BL (bit line) and the path of the bit line BLB($\overline{\text{bitline}}$) from the power supply respectively;

an equalize transistor block making the bit lines BL (bit line) and BLB($\overline{\text{bitline}}$) to be equal to a level which is an average value of voltages of the bit lines BL (bit line) and BLB($\overline{\text{bitline}}$);

a 6-T SRAM cell storing and writing data;

a sense amplifier block, wherein when the SRAM architecture performs a read operation and makes the bit lines BL (bit line) and BLB($\overline{\text{bitline}}$) generate a minimum voltage difference therebetween, the sense amplifier block reads out the data stored in the 6-T SRAM cell;

a column selection transistor block selecting a column of the data to be written in or read out when the column of the data is enabled, and disconnecting the paths of the bit lines BL (bit line) and BLB($\overline{\text{bitline}}$) from the sense amplifier block when the data stored in the 6-T SRAM cell is read out and the sense amplifier block is enabled; and a write driver performing the write operation on the 6-T SRAM cell when the SRAM architecture performs the write operation;

wherein the read/write control transistor block, the equalize transistor block, the 6-T SRAM cell, the sense amplifier block, the column selection transistor block, and write driver are electrically connected with each other, wherein when the write operation of the SRAM architecture ends with the read operation being performed thereafter by disabling the read/write control transistor block, enabling the equalize transistor block to make each of the bit lines BL (bit line) and BLB($\overline{\text{bitline}}$) have a voltage equal to a voltage level that makes the sense amplifier block generate a maximum voltage gain, enabling a word line to make the bit lines BL (bit line) and BLB($\overline{\text{bitline}}$) generate a voltage difference therebetween, enabling the sense amplifier block and disabling the column selection transistor block when the voltage difference is more than a predetermined minimum value and the voltages of the bit lines BL (bit line) and BLB ($\overline{\text{bitline}}$) are varied within a predetermined voltage range, and enabling the sense amplifier block to read the data to $\overline{\text{out}}$ and respectively.

* * * * *